(12) United States Patent
Collins et al.

(10) Patent No.: US 9,960,776 B2
(45) Date of Patent: May 1, 2018

(54) METHOD AND APPARATUS FOR GENERATING A VARIABLE CLOCK USED TO CONTROL A COMPONENT OF A SUBSTRATE PROCESSING SYSTEM

(71) Applicant: APPLIED MATERIALS, INC., Santa Clara, CA (US)

(72) Inventors: Kenneth S. Collins, San Jose, CA (US); Satoru Kobayashi, Santa Clara, CA (US); Kartik Ramaswamy, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 503 days.

(21) Appl. No.: 14/202,472

(22) Filed: Mar. 10, 2014

(65) Prior Publication Data

US 2014/0262032 A1    Sep. 18, 2014

Related U.S. Application Data

(60) Provisional application No. 61/785,555, filed on Mar. 14, 2013.

(51) Int. Cl.
*H03L 7/085* (2006.01)
*H03L 7/107* (2006.01)

(52) U.S. Cl.
CPC .............................. *H03L 7/1075* (2013.01)

(58) Field of Classification Search
CPC .............................. H03L 7/085; H03L 7/1075
See application file for complete search history.

(56) References Cited

U.S. PATENT DOCUMENTS

| | | | | |
|---|---|---|---|---|
| 5,571,366 A | * | 11/1996 | Ishii ................. | H01J 37/32082 118/723 I |
| 6,476,681 B1 | * | 11/2002 | Kirkpatrick ............. | H03L 7/093 331/1 A |
| 2003/0090305 A1 | * | 5/2003 | Kobayashi ............. | H03B 5/326 327/156 |
| 2011/0192349 A1 | * | 8/2011 | Hammond, IV ...... | C23C 16/509 118/723 E |
| 2012/0000888 A1 | * | 1/2012 | Kawasaki ......... | H01J 37/32082 216/67 |
| 2015/0000841 A1 | * | 1/2015 | Yamada ............ | H01J 37/32183 156/345.28 |

* cited by examiner

*Primary Examiner* — Yuechuan Yu
(74) *Attorney, Agent, or Firm* — Moser Taboada; Alan Taboada

(57) ABSTRACT

Methods and apparatus for generating a variable clock used to control a component of a substrate processing system are provided herein. In some embodiments, an apparatus for controlling a substrate processing system includes: a phase locked loop circuit for generating a relative clock that is phase locked to a variable frequency signal being used by a substrate processing chamber; and a controller, coupled to the phase locked loop circuit, for producing a control signal for a component of the substrate processing system, wherein the control signal is based upon the relative clock and an operating indicia of the substrate processing system.

10 Claims, 4 Drawing Sheets

METHOD AND APPARATUS FOR GENERATING A VARIABLE CLOCK USED TO CONTROL A COMPONENT OF A SUBSTRATE PROCESSING SYSTEM

CROSS-REFERENCE TO RELATED APPLICATIONS

This application claims benefit of U.S. provisional patent application Ser. No. 61/785,555, filed Mar. 14, 2013, which is herein incorporated by reference in its entirety.

FIELD

Embodiments of the present invention generally relate to substrate processing systems and, more specifically, to generating control signals for a component of a substrate processing chamber.

BACKGROUND

In integrated circuit manufacturing, plasma chambers are used to process substrates. A plasma chamber is typically coupled to a radiofrequency (RF) source to provide energy to ignite and/or maintain a plasma during substrate processing. To effectively couple RF energy to the chamber, a tunable matching circuit (also referred to as a matching unit) is connected between the RF source and the plasma chamber.

In one type of system, the RF source has a fixed frequency and matching circuit has two tunable reactors (e.g., tunable vacuum capacitors). The tunable reactors are tuned using stepper motors to provide two tuning variables for achieving and maintaining a match condition. Unfortunately, the tunable reactors are very expensive and the use of stepper motors to tune two reactors can require a significant amount of time to achieve and maintain the match condition.

To facilitate removal of one of the tunable reactors from the matching circuit, a tunable frequency RF source may be used. Consequently, one tuning variable is the tunable RF frequency and a second variable is a tunable reactor in the matching circuit. When using a tunable frequency RF source, a control system determines the chamber impedance by monitoring the phase and magnitude of the RF current and voltage being applied to the chamber. Such monitoring may be accomplished using a quadrature demodulator or digital signal processing. The RF source frequency and the matching circuit are adjusted to effectively match the RF source impedance to the estimated chamber impedance. Such a match maximizes the amount of RF energy that is coupled from the RF source to the plasma chamber. As chamber conditions vary, the matching circuit reactor value and source frequency are adjusted to maintain the impedance match.

The impedance analyzer (e.g., the quadrature demodulator) is driven with a fixed clock signal that is unrelated to the RF frequency being applied to the chamber and produces a control signal based solely upon the measurement of the applied RF voltage and RF current. Such impedance estimation can lead to inaccurate match circuit control and, at times, the inaccurate match circuit operation may lead to substrate damage or chamber damage.

Therefore, there is a need in the art for a method and apparatus for improving substrate processing chamber control.

SUMMARY

Methods and apparatus for generating a variable clock used to control a component of a substrate processing system are provided herein. In some embodiments, an apparatus for controlling a substrate processing system includes: a phase locked loop circuit for generating a relative clock that is phase locked to a variable frequency signal being used by a substrate processing chamber; and a controller, coupled to the phase locked loop circuit, for producing a control signal for a component of the substrate processing system, wherein the control signal is based upon the relative clock and an operating indicia of the substrate processing system.

In some embodiments, a method for controlling a substrate processing system includes: receiving a signal having a time-varying frequency generated by a tunable RF generator; phase locking the signal with the time-varying frequency to produce a relative clock having a frequency determined by the time-varying frequency; generating a control signal for the substrate processing system based upon operating indicia of the substrate processing system and the relative clock.

In some embodiments, a substrate processing system includes: a tunable frequency RF source for generating an RF signal with a variable frequency; a matching unit, coupled to the tunable frequency RF source, for matching the impedance of the tunable frequency RF source with a substrate processing chamber; the substrate processing chamber, coupled to the matching unit, for processing a substrate using a plasma that is ignited and/or maintained by the RF signal; and a matching unit controller, coupled to the tunable frequency RF source, the matching unit and the substrate processing chamber, for generating a matching unit control signal, where the matching unit control signal is produced using a relative clock and substrate processing chamber operating indicia, and the relative clock frequency is associated with the frequency of the RF signal.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
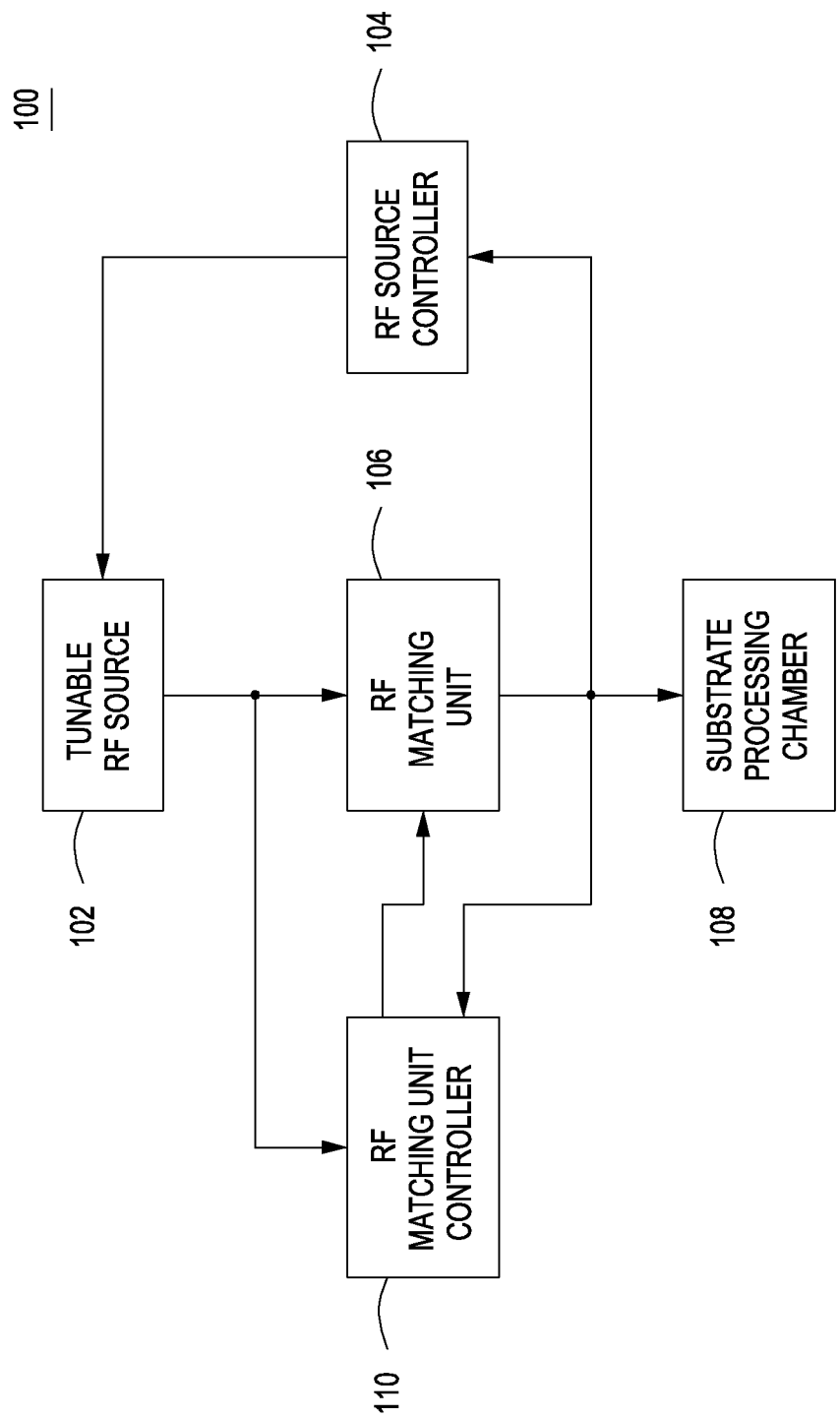
FIG. 1 is a block diagram depicting a substrate processing system in accordance with exemplary embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention is related to a method and apparatus for generating a variable clock used to control a component of a substrate processing system. In some embodiments, the inventive method and apparatus facilitate more accurate and efficient control of an RF matching unit within a substrate processing system. More specifically, a clock signal is phase locked to a variable frequency RF signal being used by a substrate processing chamber. The clock signal is a relative clock signal having a frequency that depends upon the time varying frequency of the variable frequency RF signal. In one embodiment, the relative clock is used to derive a control signal for a component of the substrate processing system, for example, to control a matching unit reactor value. By using a relative clock, as a basis for impedance match control, accurate impedance match control is achieved.

FIG. 1 depicts a block diagram of a substrate processing system 100 in accordance with one embodiment of the invention. The substrate processing system 100 comprises a plurality of components including, but not limited to, a tunable RF source 102, an RF source controller 104, an RF matching unit 106, a substrate processing chamber 108, and an RF matching unit controller 110. The tunable RF source 102 generates a time-varying frequency RF signal that is coupled to the RF matching unit 106. The RF matching unit 106 is controlled in such a manner to match the impedance of the tunable RF source 102 to the impedance of the substrate processing chamber 108 (substrate processing chamber 108 is described in detail with respect to FIG. 4 below). To achieve a match condition, both the RF signal frequency and at least one reactor valve of the RF matching unit are adjusted. The tunable RF source frequency is controlled by the RF source controller 104. The RF source controller samples the RF voltage and RF current being applied to the substrate processing chamber 108 and derives a control signal for the tunable RF source 102. Other parameters and/or characteristics of the substrate processing chamber 108 may also be measured and used to control the RF frequency. Such frequency control is performed in a well-known manner.

The RF matching unit controller 110 receives as input signals the variable frequency signal from the tunable RF source 102 and a sample of the RF voltage and RF current being applied to the substrate processing chamber 108. From these inputs, the RF matching unit controller 110 generates a control signal for the RF matching unit 106. Embodiments of the present invention reside in the RF matching unit controller 110. Alternative embodiments of the invention, may utilize a controller similar to the RF matching unit controller to control other aspects and/or components of the substrate processing system.

Figure 2:
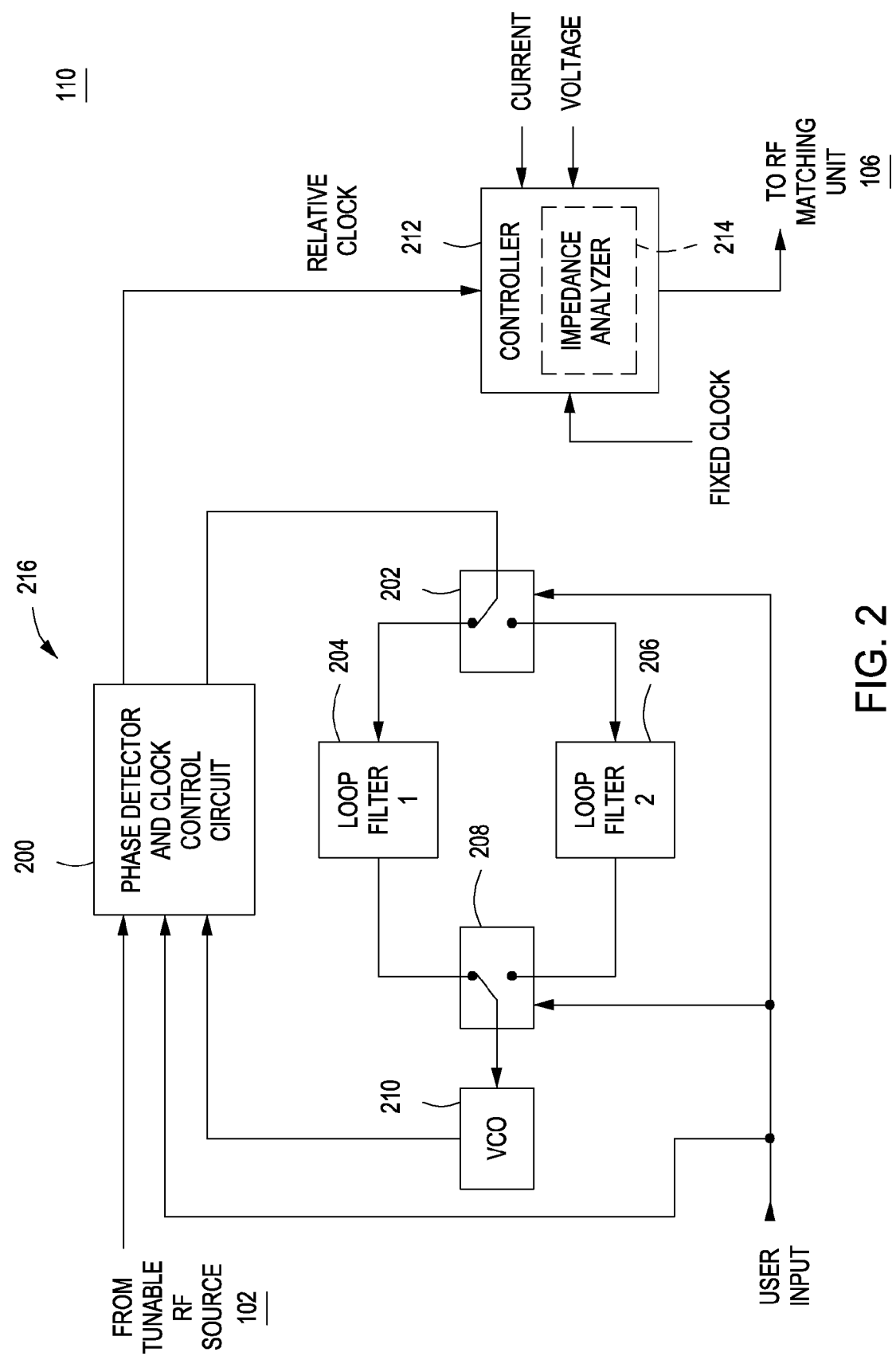
FIG. 2 is a block diagram depicting an RF matching unit controller in accordance with exemplary embodiments of the present invention.

FIG. 2 depicts a block diagram of the RF matching unit controller 110 in accordance with some embodiments of the present invention. The RF matching unit controller 110 comprises a phase locked loop (PLL) circuit 216 coupled to a controller 212. The PLL circuit 216 generates a variable clock having a frequency that is related to the frequency of the tunable RF source 102. The controller 212 uses this "relative" clock to generate a control signal for the RF matching unit 106 and/or other chamber components.

The PLL circuit 216 comprises a phase detector and clock control circuit 200, a first switch 202, at least one loop filter (a first loop filter 204 and a second loop filter 206 shown), a second switch 208, and a voltage controlled oscillator (VCO) 210. The phase detector and clock control circuit 200 maybe an integrated circuit such as an AD9510 manufactured by Analog Devices, Inc. located at 3 Technology Way, Norwood, Mass. This integrated circuit provides, in a single package, phase detection circuitry, a programmable dual-modulus prescaler, programmable frequency dividers, and a charge pump. In other embodiments, the circuit may be designed with discrete components, a combination of integrated circuits, and/or the like.

The PLL circuit 216 operates as a typical phase locked loop wherein the phase difference between the output signal of the voltage controlled oscillator 210 and the RF signal from the RF source 102 is generated as an error signal (e.g., a phase error signal). The error signal is applied to a loop filter 204 or 206. The loop filters 204 or 206 control convergence time, phase noise, and spurious frequencies within the error signal being fed back to the voltage controlled oscillator. In the embodiment depicted, the loop filters 204 and 206 are selectable, as shall be described in detail below. The loop filters 204 and 206 are low pass filters. The filtered error signal is coupled to the control input of the voltage controlled oscillator 210. As such, the filtered error signal provides negative feedback to control the voltage controlled oscillator frequency. The level of feedback is controlled by the phase detector gain, voltage controlled oscillator gain, frequency dividers/prescalers, and loop filter characteristics. As such, the signals become phase locked. Consequently, the output of the phase lock loop circuit 216 is a clock signal having a frequency that is directly related to the frequency of the RF source (i.e., frequency changes of the RF source are proportionally reflected in frequency changes of the clock signal). Thus, this clock signal is a relative clock.

In one exemplary embodiment, the RF source generates an RF signal having a frequency that may vary from 58 MHz to 62 MHz. Other embodiments may use other frequency ranges varying about, for example, 13.56 MHz, 27 MHz, and the like. The voltage controlled oscillator signal may have a nominal frequency of 400 MHz. The prescaling within the phase detector and clock control circuit 200 adjusts the frequencies to an integer multiple of each other to facilitate phase detection. By using the programmable frequency dividers within the circuit 200, the nominal frequency of the relative clock may be any integer divided value of the voltage controlled oscillator frequency. The value is user programmable.

The relative clock is applied to the controller 212. In one embodiment, the controller 212 may be embodied in a field programmable gate array (FPGA) or a digital signal processor (DSP). The controller 212 comprises an impedance analyzer 214 that is used to compute an estimated impedance of the process chamber such that a control signal can be generated for the RF matching unit 106 based upon the computed impedance. Those skilled in the art will understand that there are many techniques used for computing a representation of impedance. For example, it is well-known that a quadrature demodulator may be utilized to analyze the phase difference between the RF current and RF voltage being applied to the chamber. In one embodiment, current and voltage probes attached to the cabling that supplies the RF energy to the chamber provide a voltage and current measurement (generally referred to as an operating indicia) to be used by the controller 212. Other operating indicia may be used to estimate impedance of the chamber including, for example, forward and reflected power. The impedance analyzer 214 uses the operating indicia as well as the relative clock to compute a representation of the chamber impedance. Based upon this representation, a control signal is generated to adjust at least one reactor (e.g., vacuum capacitor) within the RF matching unit 106. Typically, this control signal controls a stepper motor that is coupled to the reactor.

Since the RF matching unit controller 110 may be used with any number of different RF matching units available on the market, where each unit may have different control parameters, the PLL circuit 216 comprises user selectable control parameters such as a plurality of loop filters and clock speeds. Although two selectable loop filters 204 and 206 are depicted, any number of loop filters may be used. Each loop filter 204 or 206 can be designed to provide a different operational characteristic for the PLL circuit 216. For example, the first loop filter 204 may have a bandwidth of 200 kHz while the second loop filter 206 may have a bandwidth of 30 kHz. As such, using the first loop filter 204 can achieve a convergence time of 10 μs, while using the second loop filter provides a convergence time of 100 μs. Depending on the required matching unit control parameters, a user may select a faster convergence or a slower convergence. Switches 202 and 208 are shown to indicate the selectability of the loop filters. In an analog hardware implementation, the switches are hardware components. If the implementation uses digital circuitry or is formed in software, actual hardware switches may not be used and the switching function will be digital or software based.

In addition, the PLL circuit 216 allows a user to program the frequency dividers within the phase detector and clock control circuit 200 such that various frequencies can be used for the relative clock. For example, with a nominal 400 MHz signal from the voltage controlled oscillator 210 and a nominal 60 MHz RF source frequency, the user may program the frequency dividers to generate a 100 MHz relative clock frequency or a 200 MHz relative clock frequency. In some embodiments, the decision to use 100 MHz or 200 MHz is based on the performance capability of the controller 212, e.g., a higher performance FPGA enables a higher relative clock frequency to be used. In accordance with various embodiments of the invention, the nominal frequency variation of the relative clock will vary in relation to the frequency variation of the tuneable RF source 102.

In some embodiments of the invention, a substrate processing system may use both a tunable RF source as well as a fixed RF source depending on the processing parameters for the substrate. Consequently, in one embodiment of the invention, the RF matching unit controller 110 is capable of utilizing a fixed clock rather than the relative clock. As such, one input to the controller 212 is a fixed clock that can be selectively utilized by the impedance analyzer 214 in lieu of using the relative clock. For example, during some processes, a turntable RF source may be used to supply a 60 MHz variable frequency signal to the chamber. At various periods in the process, the 60 MHz turntable RF source may be switched with a fixed RF source operating at 13.56 MHz. In other embodiments, some processes may require a fixed 40 MHz and other processes may require a variable frequency 60 MHz. In each instance, the controller 212 can switch from using the relative clock to using the fixed clock, as required. The frequencies used may vary from implementation to implementation—the actual frequencies used are considered a design choice.

Figure 3:
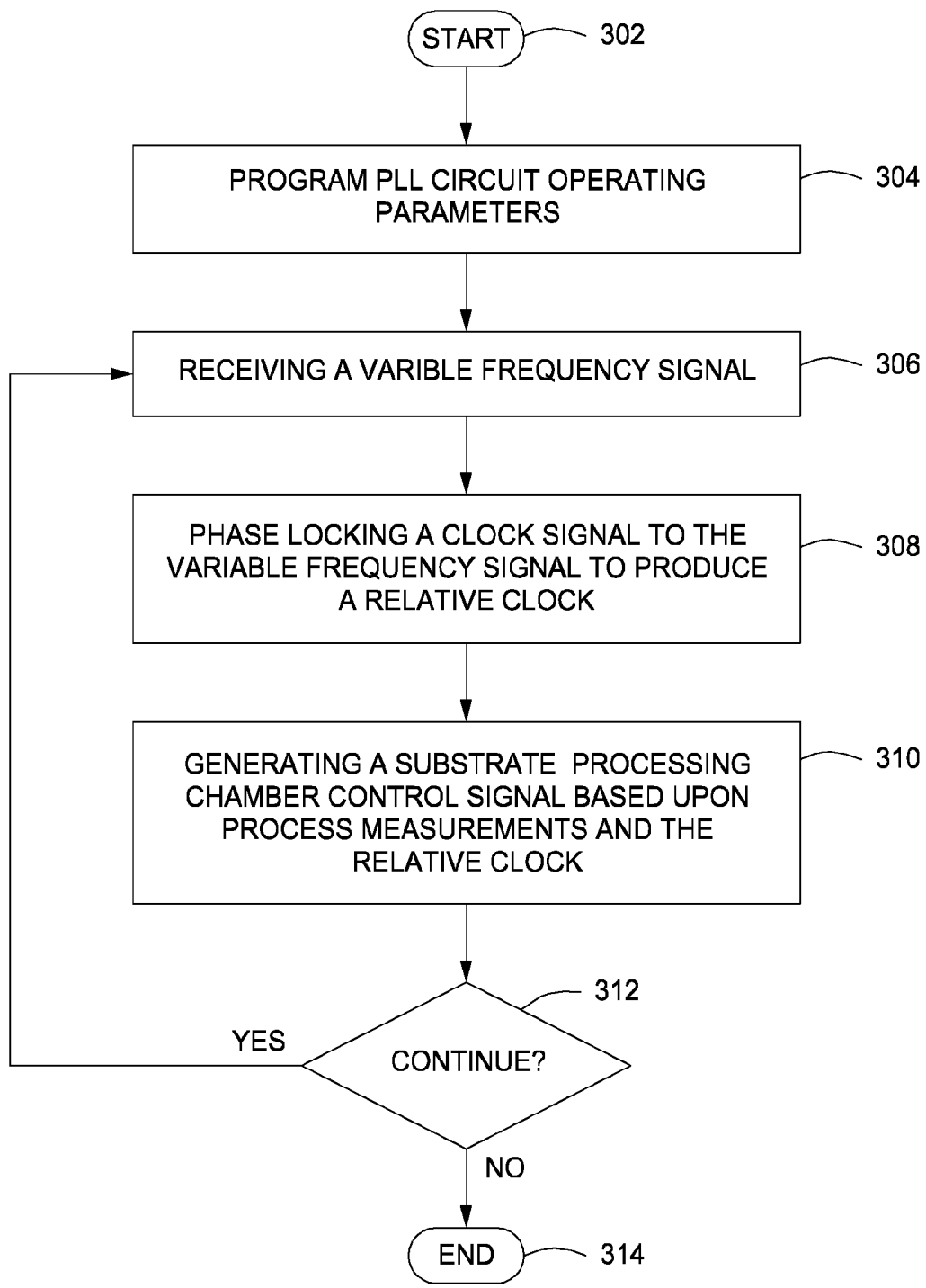
FIG. 3 is a flow diagram of a method of substrate processing chamber control in accordance with exemplary embodiments of the present invention.

FIG. 3 depicts a flow diagram of a method 300 for generating a control signal in accordance with embodiments of the present invention. The method 300 begins at step 302 and proceeds to step 304 wherein a user programs the PLL circuit operating parameters. Such programming, for example, may include selecting a switch to choose a loop filter, selecting a phase-detector operating frequency determined by frequency divider and/or prescaler, selecting a relative clock frequency and output frequencies. At step 306, the method 300 receives a variable frequency signal from, for example, the RF source driving the matching unit. At step 308, the method 300 phase locks a clock signal to the variable frequency signal to produce the relative clock. The relative clock has a frequency that varies in proportion to the variable frequency signal.

At step 310, the method generates a substrate processing chamber control signal aced upon process chamber measurements and the relative clock. The control signal may be used in one embodiment to control the value of at least one reactor in a matching unit. In other embodiments the control signal may be used to control other parameters or components of the substrate processing system.

At step 312, the method 300 queries whether the method should continue to adjust the control signal in view of the variable frequency signal. If the query is answered affirmatively, the method 300 continues at step 306. If, on the other hand, the query at step 312 is negatively answered, the method 300 ends at step 314

Figure 4:
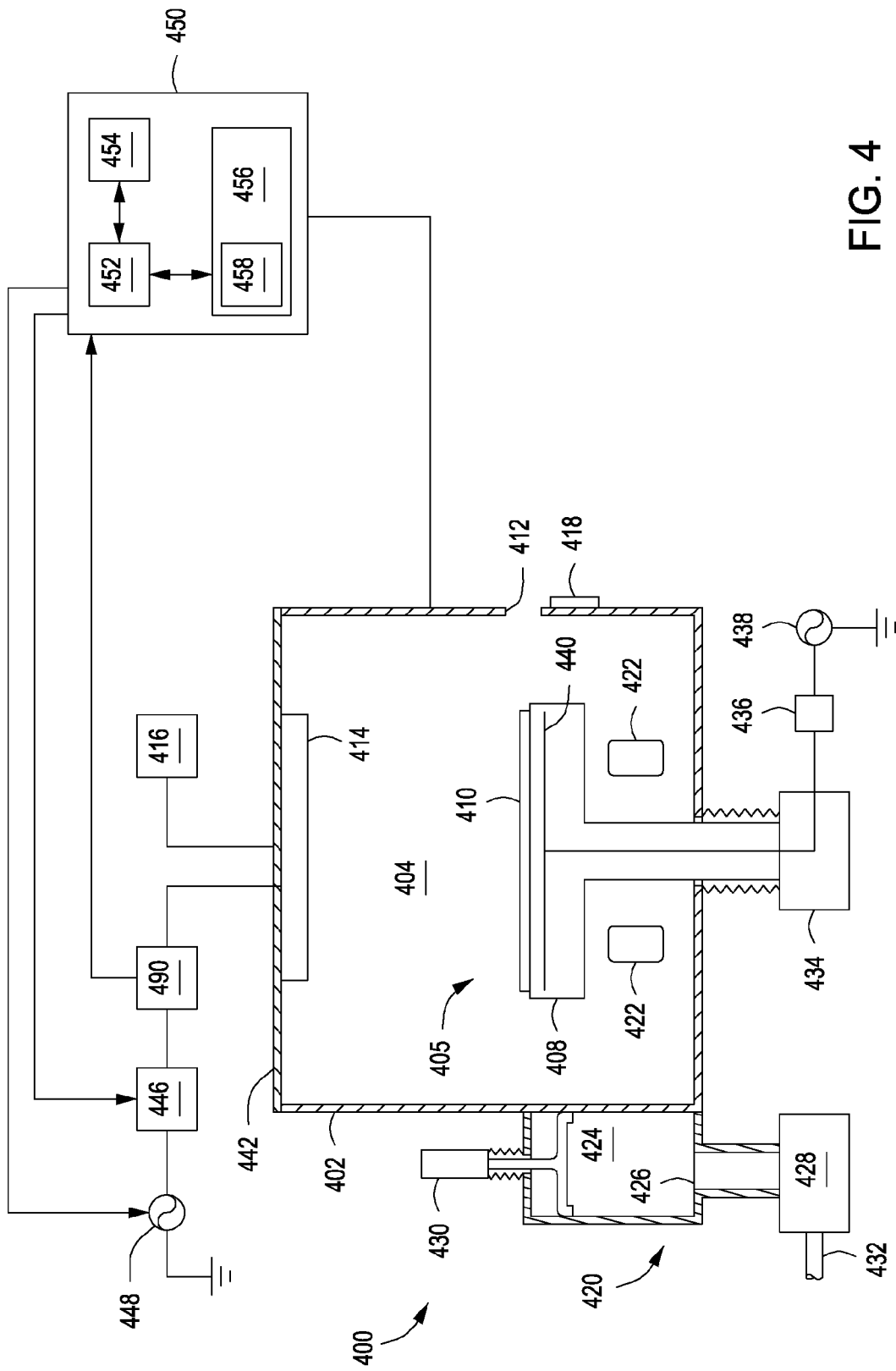
FIG. 4 depicts an apparatus suitable for processing semiconductor substrates in accordance with exemplary embodiments of the present invention.

FIG. 4 depicts an apparatus 400 suitable for processing a substrate in accordance with some embodiments of the present invention. The apparatus 400 may comprise a controller 450 and a process chamber 402 having an exhaust system 420 for removing excess process gases, processing by-products, or the like, from the interior of the process chamber 402. Exemplary process chambers may include the DPS®, ENABLER®, ADVANTEDGE™, or other process chambers, available from Applied Materials, Inc. of Santa Clara, Calif. Other suitable process chambers may similarly be used.

The process chamber 402 has an inner volume 405 that may include a processing volume 404. The processing volume 404 may be defined, for example, between a substrate support pedestal 408 disposed within the process chamber 402 for supporting a substrate 410 thereupon during processing and one or more gas inlets, such as a showerhead 414 and/or nozzles provided at desired locations. In some embodiments, the substrate support pedestal 408 may include a mechanism that retains or supports the substrate 410 on the surface of the substrate support pedestal 408, such as an electrostatic chuck, a vacuum chuck, a substrate retaining clamp, or the like (not shown). In some embodiments, the substrate support pedestal 408 may include mechanisms for controlling the substrate temperature (such as heating and/or cooling devices, not shown) and/or for controlling the species flux and/or ion energy proximate the substrate surface.

For example, in some embodiments, the substrate support pedestal 408 may include an RF bias electrode 440. The RF bias electrode 440 may be coupled to one or more bias power sources (one bias power source 438 shown) through one or more respective matching networks (matching network 436 shown). The one or more bias power sources may be capable of producing up to 12,000 W at a frequency of about 2 MHz, or about 13.56 MHz, or about 60 Mhz. In some embodiments, two bias power sources may be provided for coupling RF power through respective matching networks to the RF bias electrode 440 at respective frequencies of about 2 MHz and about 13.56 MHz. In some embodiments, three bias power sources may be provided for coupling RF power through respective matching networks to the RF bias electrode 440 at respective frequencies of about 2 MHz, about 13.56 MHz, and about 60 Mhz. The at least one bias power source may provide either continuous or pulsed power. In some embodiments, the bias power source alternatively may be a DC or pulsed DC source.

The substrate 410 may enter the process chamber 402 via an opening 412 in a wall of the process chamber 402. The opening 412 may be selectively sealed via a slit valve 418, or other mechanism for selectively providing access to the interior of the chamber through the opening 412. The substrate support pedestal 408 may be coupled to a lift mechanism 434 that may control the position of the substrate support pedestal 408 between a lower position (as shown) suitable for transferring substrates into and out of the chamber via the opening 412 and a selectable upper position suitable for processing. The process position may be selected to maximize process uniformity for a particular process. When in at least one of the elevated processing positions, the substrate support pedestal 408 may be disposed above the opening 412 to provide a symmetrical processing region.

The one or more gas inlets (e.g., the showerhead 414) may be coupled to a gas supply 416 for providing one or more process gases into the processing volume 404 of the process chamber 402. Although a showerhead 414 is shown in FIG. 4, additional or alternative gas inlets may be provided such as nozzles or inlets disposed in the ceiling or on the sidewalls of the process chamber 402 or at other locations suitable for providing gases as desired to the process chamber 402, such as the base of the process chamber, the periphery of the substrate support pedestal, or the like.

In some embodiments, the apparatus 400 may utilize capacitively coupled RF power for plasma processing, although the apparatus may also or alternatively use inductive coupling of RF power for plasma processing. For example, the process chamber 402 may have a ceiling 442 made from dielectric materials and a showerhead 414 that is at least partially conductive to provide an RF electrode (or a separate RF electrode may be provided). The showerhead 414 (or other RF electrode) may be coupled to one or more RF power sources (one RF power source 448 shown) through one or more respective matching networks (matching unit 446 shown and described in detail above with respect to FIGS. 1, 2, and 3). Control of the RF power source 448 and matching unit 446 is provided by embodiments of the invention as described above contained within a controller 450. To facilitate impedance matching, a voltage and current probe 490 (e.g., a directional coupler) provides the operational indicia for the controller 450 to utilize in achieving and maintaining an impedance match condition between the RF power source 448 and the process chamber 402. The one or more RF sources may be capable of producing up to about 5,000 W at a frequency of about 2 MHz and or about 13.56 MHz or high frequency, such as 27 MHz and/or 60 MHz.

The exhaust system 420 generally includes a pumping plenum 424 and one or more conduits that couple the pumping plenum 424 to the inner volume 405 (and generally, the processing volume 404) of the process chamber 402, for example via one or more inlets 422 (two inlets shown in FIG. 4). A vacuum pump 428 may be coupled to the pumping plenum 424 via a pumping port 426 for pumping out the exhaust gases from the process chamber 402. The vacuum pump 428 may be fluidly coupled to an exhaust outlet 432 for routing the exhaust as required to appropriate exhaust handling equipment. A valve 430 (such as a gate valve, or the like) may be disposed in the pumping plenum 424 to facilitate control of the flow rate of the exhaust gases in combination with the operation of the vacuum pump 428. Although a z-motion gate valve is shown, any suitable, process compatible valve for controlling the flow of the exhaust may be utilized.

To facilitate control of the process chamber 402 as described above, the controller 450 may be one of any form of general-purpose computer processor or micro controller unit (MCU) that can be used in an industrial setting for controlling various chambers and sub-processors. The memory, or computer-readable medium, 456 of the CPU 452 may be one or more of readily available memory such as random access memory (RAM), read only memory (ROM), floppy disk, hard disk, or any other form of digital storage, local or remote. The support circuits 454 are coupled to the CPU 452 for supporting the processor in a conventional manner. These circuits include cache, power supplies, clock circuits, input/output circuitry and subsystems, and the like.

Control software may generally be stored in the memory 456 as a software routine 458 that, when executed by the CPU 452, causes the process chamber 402 to perform methods of the present invention. The software routine 458 may also be stored and/or executed by a second CPU (not shown) that is remotely located from the hardware being controlled by the CPU 452. Some or all of the method of the present invention may also be performed in hardware. As such, the invention may be implemented in software and executed using a computer system, in hardware as, e.g., an application specific integrated circuit or other type of hardware implementation, or as a combination of software and hardware. The software routine 458 may be executed after the substrate 410 is positioned on the substrate support pedestal 408. The software routine 458, when executed by the CPU 452, transforms the general purpose computer into a specific purpose computer (controller) 450 that controls the chamber operation such that the methods disclosed herein are performed.

While the foregoing is directed to embodiments of the present invention, other and further embodiments of the invention may be devised without departing from the basic scope thereof.

The invention claimed is:

1. A substrate processing system, comprising:
   a tunable frequency RF source for generating an RF signal with a variable frequency;
   a matching unit, coupled to the tunable frequency RF source, for matching an impedance of the tunable frequency RF source with an impedance of a substrate processing chamber;
   the substrate processing chamber, coupled to the matching unit, for processing a substrate using a plasma that is ignited and/or maintained by the RF signal; and
   a matching unit controller, coupled to the tunable frequency RF source, the matching unit and the substrate processing chamber, for generating a matching unit control signal that controls a reactor value for the matching unit, where the matching unit control signal is produced using substrate processing chamber operating indicia and a relative clock signal having a relative clock frequency, and where the relative clock signal is phase locked to the RF signal using a phase locked loop circuit.

2. The substrate processing system of claim 1, wherein the substrate processing chamber operating indicia are a voltage and a current of the RF signal being applied to the substrate processing chamber.

3. The substrate processing system of claim 1, wherein the substrate processing chamber operating indicia is an RF voltage and RF current measurement of the RF signal being applied to the substrate processing chamber.

4. The substrate processing system of claim 1, wherein the matching unit controller comprises:
- a phase detector for generating a phase error signal indicative of phase error between the RF signal and a signal from a voltage controlled oscillator;
- at least one loop filter, coupled to the phase detector, for achieving a negative feedback to control the voltage controlled oscillator; and
- a clock control circuit, coupled to the loop filter, for generating the relative clock signal.

5. The substrate processing system of claim 4, wherein the at least one loop filter comprises a plurality of selectable loop filters, where each loop filter in the at least one loop filter has a different filter characteristic.

6. The substrate processing system of claim 4, wherein the clock control circuit produces a signal with a frequency of about 400 MHz.

7. The substrate processing system of claim 4, wherein the substrate processing chamber operating indicia is an RF voltage and RF current measurement of the RF signal being applied to the substrate processing chamber.

8. The substrate processing system of claim 4, wherein the RF signal has a variable frequency in a range of about 58 MHz to about 62 MHz.

9. The substrate processing system of claim 4, wherein the relative clock signal has a selectable frequency.

10. The substrate processing system of claim 9, wherein the selectable frequency for the relative clock signal is 100 MHz or 200 Mhz.

* * * * *